US009269887B1

(12) United States Patent
Juskey et al.

(10) Patent No.: US 9,269,887 B1
(45) Date of Patent: Feb. 23, 2016

(54) ULTRATHIN FLIP-CHIP PACKAGING TECHNIQUES AND CONFIGURATIONS

(71) Applicant: TriQuint Semiconductor, Inc., Hillsboro, OR (US)

(72) Inventors: Frank J. Juskey, Opopka, FL (US); Robert C. Hartmann, Opopka, FL (US); Thomas S. Morris, Lewisville, NC (US); Howard T. Glascock, Graham, NC (US); Jose F. Ordonez, Longwood, FL (US)

(73) Assignee: TriQuint Semiconductor, Inc., Hillsboro, OR (US)

(*) Notice: Subject to any disclaimer, the term of this patent is extended or adjusted under 35 U.S.C. 154(b) by 0 days.

(21) Appl. No.: 14/619,927

(22) Filed: Feb. 11, 2015

Related U.S. Application Data

(60) Provisional application No. 62/100,451, filed on Jan. 6, 2015.

(51) Int. Cl.
| H01L 23/31 | (2006.01) |
| H01L 41/311 | (2013.01) |
| H01L 41/053 | (2006.01) |
| H01L 41/08 | (2006.01) |
| H01L 41/25 | (2013.01) |
| H01L 25/16 | (2006.01) |
| H01L 23/36 | (2006.01) |
| H01L 23/538 | (2006.01) |

(52) U.S. Cl.
CPC .............. *H01L 41/311* (2013.01); *H01L 23/36* (2013.01); *H01L 23/5383* (2013.01); *H01L 23/5384* (2013.01); *H01L 23/5386* (2013.01); *H01L 25/16* (2013.01); *H01L 41/053* (2013.01); *H01L 41/0533* (2013.01); *H01L 41/08* (2013.01); *H01L 41/25* (2013.01)

(58) Field of Classification Search
CPC .............................. H01L 21/56; H01L 23/315
USPC .................. 257/778, 698, 724; 438/108, 124
See application file for complete search history.

(56) References Cited

U.S. PATENT DOCUMENTS

| 2004/0227258 | A1* | 11/2004 | Nakatani | H01L 23/49805 257/787 |
| 2008/0023805 | A1* | 1/2008 | Howard | H01L 23/3121 257/666 |
| 2008/0076209 | A1* | 3/2008 | Klink | H01L 21/56 438/112 |
| 2008/0224324 | A1* | 9/2008 | Kawada | H01L 23/3121 257/778 |
| 2008/0284045 | A1* | 11/2008 | Gerber | H01L 21/561 257/778 |
| 2010/0244229 | A1* | 9/2010 | Vittu | H01L 25/561 257/692 |
| 2013/0234344 | A1* | 9/2013 | Juskey | H01L 25/16 257/778 |
| 2014/0162404 | A1* | 6/2014 | Zhang | H01L 23/49582 438/108 |
| 2015/0194377 | A1* | 7/2015 | Mahler | H01L 23/49586 257/676 |

* cited by examiner

*Primary Examiner* — George Fourson, III
(74) *Attorney, Agent, or Firm* — Withrow & Terranova, P.L.L.C.

(57) ABSTRACT

Embodiments include but are not limited to apparatuses and systems including microelectronic devices including a package substrate, a plurality of electronic components disposed on and electrically coupled with the package substrate at one or more sides of the package substrate, one or more hollow cavity sheet molds surrounding the plurality of electronic components and coupled with one or more sides of the package substrate, and a plurality of through-mold vias to couple the package substrate with an external surface of at least one of the one or more hollow cavity sheet molds. The microelectronic device may be a chip-scale package or module. Methods and systems for making the same also are described.

25 Claims, 7 Drawing Sheets

US 9,269,887 B1

ULTRATHIN FLIP-CHIP PACKAGING TECHNIQUES AND CONFIGURATIONS

CROSS REFERENCE TO RELATED APPLICATIONS

The present application claims priority to U.S. Provisional Patent Application No. 62/100,451 filed Jan. 6, 2015, entitled, "Ultrathin Flip-Chip Packaging Techniques and Configurations," the entire specification of which is hereby incorporated by reference in its entirety for all purposes, except for those sections, if any, that are inconsistent with this specification.

TECHNICAL FIELD

Embodiments of the present disclosure relate generally to microelectronic device packages, and more particularly to flip-chip packaging techniques and configurations.

BACKGROUND

In the current state of integrated circuit technology, an integrated circuit device will often be in the form of a die or a chip. One or more die sometimes will be mounted onto a carrier substrate to form a packaged microelectronic device. Integrated circuit (IC) packages may include a variety of components (e.g., dies and/or passive components) coupled with a package substrate using solderable material. For example, solder joints may be formed to electrically and/or mechanically couple the components to the package substrate. Mobile electronic devices such as cell phones benefit from size reductions in their component electronic parts such as packaged microelectronic devices, allowing decreased size and/or weight or additional room for other components in a fixed footprint.

BRIEF DESCRIPTION OF THE DRAWINGS

Embodiments of the present invention will be readily understood by the following detailed description in conjunction with the accompanying drawings. To facilitate this description, like reference numerals designate like structural elements. Embodiments of the invention are illustrated by way of example and not by way of limitation in the figures of the accompanying drawings.

DETAILED DESCRIPTION OF EMBODIMENTS OF THE INVENTION

Embodiments of the present disclosure describe flip-chip packaging techniques and configurations. In the following detailed description, reference is made to the accompanying drawings which form a part hereof wherein like numerals designate like parts throughout, and in which is shown by way of illustration embodiments in which the invention may be practiced. It is to be understood that other embodiments may be utilized and structural or logical changes may be made without departing from the scope of the present invention. Therefore, the following detailed description is not to be taken in a limiting sense, and the scope of embodiments in accordance with the present invention is defined by the appended claims and their equivalents.

Various operations may be described as multiple discrete operations in turn, in a manner that may be helpful in understanding embodiments of the present invention; however, the order of description should not be construed to imply that these operations are order dependent. Moreover, some embodiments may include more or fewer operations than may be described.

The description may use the phrases "in an embodiment," "in embodiments," "in some embodiments," or "in various embodiments," which may each refer to one or more of the same or different embodiments. Furthermore, the terms "comprising," "including," "having," and the like, as used with respect to embodiments of the present invention, are synonymous.

The phrase "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other.

The phrase "formed on," along with its derivatives, may be used herein. "Formed on" in the context of a layer being "formed on" another layer may mean that a layer is formed above, but not necessarily in direct physical or electrical contact with, another layer (e.g., there may be one or more other layers interposing the layers). In some embodiments, however, "formed on" may mean that a layer is in direct physical contact with at least a portion of a top surface of another layer. Usage of terms like "top" and "bottom" are to assist in understanding, and they are not to be construed to be limiting on the disclosure.

The term "active surface" as used herein may refer to the surface of a die having the active regions/areas, as is known to those having skill in the art. The active surface of a die may include any one or more of various circuitry components, such as transistors, memory cells, passive components, and the like.

For the purposes of the present invention, the phrases "A or B" and "A and/or B" mean (A), (B), or (A and B).

Figure 1:
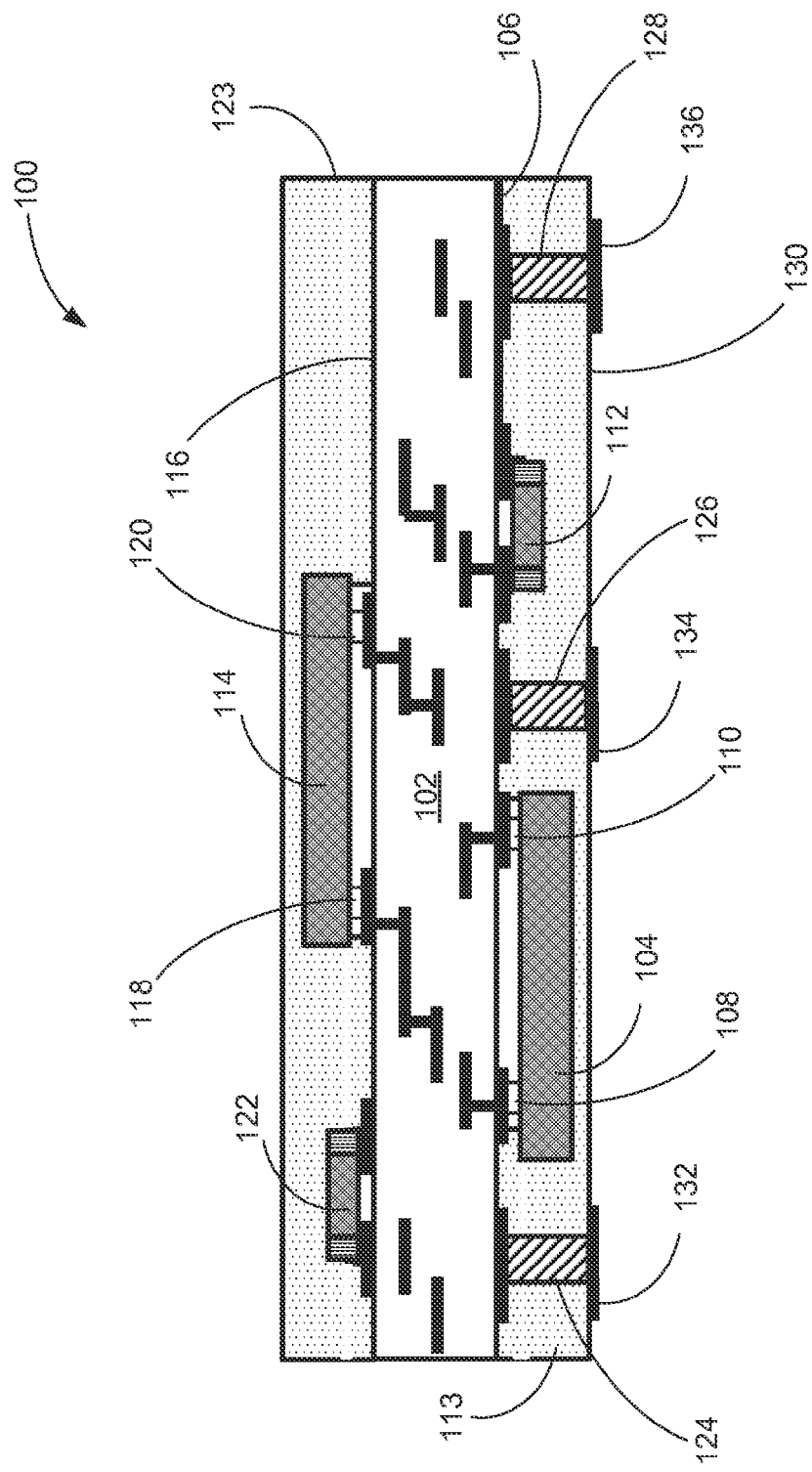
FIG. 1 illustrates a cross-sectional view of a microelectronic device in accordance with various embodiments.

A cross-sectional side view of an example microelectronic device 100 is illustrated in FIG. 1. As illustrated, the microelectronic device 100 (also referred to as "device 100") may include a multilayer laminate package substrate 102 and a plurality of electronic components coupled with the package substrate 102. The package substrate 102 may be a six-layer laminate having a thickness of approximately 210 micrometers (μm) in various embodiments. The package substrate 102 may be a multilayer printed circuit board (PCB) in various embodiments.

The plurality of electronic components may include one or more dies that may include devices such as a bulk acoustic wave (BAW) device or a surface acoustic wave (SAW) device, for example, that may be coupled with the package substrate 102 in a flip-chip configuration and surrounded by one or more hollow cavity sheet molds coupled with one or more sides of the package substrate 102 in various embodiments. The one or more hollow cavity sheet molds surrounding the one or more dies may provide protection against dust and/or other factors in the environment, and may eliminate the need for a house on the one or more dies, thus reducing a height of the microelectronic device 100 in the Z direction. In a flip-chip configuration, an active surface (e.g., a surface having electronic devices formed thereon) of a die may be coupled with the package substrate 102 using interconnect structures formed on the active surface. The plurality of electronic components may include a first die 104 coupled with a first side 106 of the package substrate 102 such as by using pillars 108 and 110, for example. In embodiments, the pillars 108, 110 may be approximately 30 μm in height and the first die 104 may be approximately 100 μm in height. Other coupling structures such as spheres or cylinders may be used in various embodiments. The first die 104 may include an active device such as a SAW transmitter (TX) and/or receiver (RX) device, a BAW TX and/or RX device, or a power amplifier (PA) device, for example. The first die 104 may include one or more passive components such as may be present on an integrated passive device (IPD) in various embodiments. Generally, in embodiments, active components or devices include a transistor with a 'gate' in its structure and devices such as resistors, inductors, and capacitors are considered to be passive components.

A passive component 112 may also be coupled with the first side 106 of the package substrate 102. The passive component 112 may be a passive component in a 01005 package having a thickness of approximately 200 μm, for example. The passive component 112 may include one or more capacitors, inductors, resistors, transformers, and/or passive filters, for example. The passive component 112 may include other types of devices in various embodiments. In embodiments, an IPD having a thickness of approximately 100 μm may be used rather than a device having a 01005 package type. Additional or fewer passive and/or active components may be coupled with the first side 106 of the package substrate 102 in various embodiments. A first hollow cavity sheet mold 113 may be coupled with the first side 106 of the package substrate 102 and may surround the first die 104 and the passive component 112.

The plurality of electronic components may also include a second die 114 coupled with a second side 116 of the package substrate 102 such as by using pillars 118 and 120, for example. Other coupling structures such as spheres or cylinders may be used in various embodiments. The second die 114 may include an active device such as a SAW TX and/or RX device, a BAW TX and/or RX device, or a PA device, for example. The second die 214 may include one or more passive components such as may be present on an IPD in various embodiments. A passive component 122 may also be coupled with the second side 116 of the package substrate 102. The passive component 122 may be a passive component in a 01005 package, for example. Additional or fewer passive and/or active components may be coupled with the second side 116 of the package substrate 102 in various embodiments. A second hollow cavity sheet mold 123 may be coupled with the second side 116 of the package substrate 102 and may surround the second die 114 and the passive component 122. In embodiments, the first and second hollow cavity sheet molds 113, 123 may include a silica filled material held in an amorphous epoxy resin and each be applied in two sheets. The first sheet, closest to the package substrate 102 may be a low flow, high viscosity, material and the second sheet may have low viscosity, to enable good planarity in embodiments.

In various embodiments, the dies 104, 114 and/or passive components 112, 122 may be electrically and/or mechanically coupled with the package substrate 102 using one or more solder bonds that are formed using a solderable material. For example, in some embodiments, the passive components 112, 122 may be coupled with the package substrate 102 using solder bonds formed of solder paste. The solder paste may include a mixture of a fluxing agent and a solderable material. The solderable material for the solder bonds may include, for example, tin, silver, gold, copper, lead, antimony, or alloys thereof. The solder bonds may be formed using other solderable materials in some embodiments.

In embodiments, the package substrate 102 may include a plurality of pads formed on the package substrate 102. The pads may be configured to receive a corresponding plurality of interconnect structures formed on the dies 104, 114. The interconnect structures of the dies 104, 114 may be electrically and/or mechanically coupled with the pads of the package substrate 102 using solder bonds. The pads and the interconnect structures may be composed of an electrically conductive material such as a metal (e.g., copper). In embodiments, the interconnect structures may include the pillars 108, 110, 118, 120 that extend to provide a majority of a gap distance between the package substrate 102 and the dies 104, 114. In various embodiments, the interconnect structures may include pads, bumps, posts, or other structures to facilitate electrical and/or mechanical coupling of the dies 104, 114 to the package substrate 102. The interconnect structures may extend to provide less than a majority of the gap distance in some embodiments. The solder bonds may include solder bumps in various embodiments. The solder bonds may attach the interconnect structures to the pads on the package substrate 102 facing the dies 104, 114.

In some embodiments, a fluxing underfill material may be disposed on the package substrate 102 between one or more electronic components such as dies 104, 114 and the package substrate 102. The fluxing underfill material may include a fluxing agent and/or an epoxy material. The fluxing agent may facilitate formation of solder bonds by, for example, removing oxidation from solderable surfaces. The fluxing underfill material may include an epoxy material that is configured to harden during a solder reflow process. The fluxing underfill material may include additional and/or other materials in some embodiments.

A plurality of through-mold vias such as vias 124, 126, 128 may couple the package substrate 102 with an external surface 130 of the first hollow cavity sheet mold 113. In embodiments, the vias may be created at least in part using a laser ablation technique and a plating process. The vias 124, 126, 128 may be created by placing solder balls or copper blocks as a contact via material on the package substrate 102 (e.g., multilayer laminate), covering the preplaced solder ball or copper block via materials with sheet mold, laser ablating an opening to expose the solder ball or copper block contact points, and plating to create an input/output (IO) connection, in various embodiments. A plurality of contacts such as contacts 132, 134, 136 may be located on the external surface 130 of the first hollow cavity sheet mold 113 and be electrically coupled with the plurality of through-mold vias 124, 126, 128 in various embodiments. The contacts 132, 134, 136 may be land grid array (LGA) pads, for example. The contacts 132, 134, 136 may be plated with a material such as electroless nickel electroless palladium immersion gold (ENEPIG), nickel/gold (NiAu), or other solderable surface in various embodiments.

In embodiments, stacking die on both sides of the package substrate 102, which may be a printed circuit board, may reduce an X—Y footprint of the device in comparison to single layer devices. Although two dies and two passive components are shown in FIG. 1, it should be understood that differing numbers and/or types of components may be used in various embodiments. Components such as a gallium arsenide (GaAs) device, a gallium nitride (GaN) device, a switch such as a single-pole, four throw (SP4T) switch, a processor die, and/or a memory die may be coupled with the package substrate 102, for example.

Figure 2:
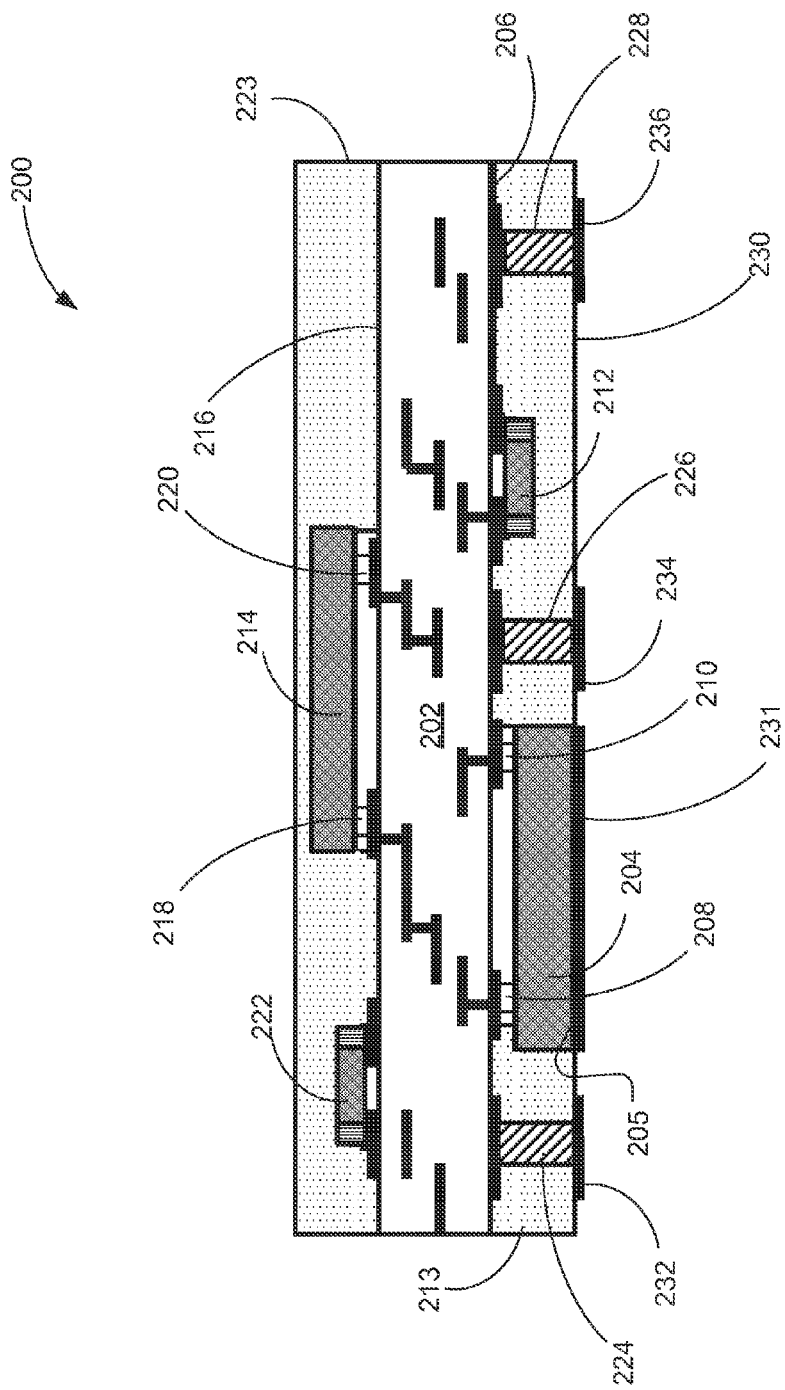
FIG. 2 illustrates a cross-sectional view of a microelectronic device that includes a heatsink in accordance with various embodiments.

FIG. 2 illustrates a cross-sectional view of a microelectronic device 200, including a heatsink in accordance with various embodiments. The device 200 may include a multilayer laminate package substrate 202 and a plurality of electronic components coupled with the package substrate 202. Aspects of the device 200 may be similar to those of the device 100 in various embodiments. The device 200 may include a first die 204 coupled with a first side 206 of the package substrate 202 such as by using pillars 208 and 210, for example. Other coupling structures such as spheres or cylinders may be used in various embodiments. A passive component 212 may also be coupled with the first side 206 of the package substrate 202. Additional or fewer passive and/or active components may be coupled with the first side 206 of the package substrate 202 in various embodiments. A first hollow cavity sheet mold 213 may be coupled with the first side 206 of the package substrate 202 and may surround the first die 204 and the passive component 212. The first die 204 has an outer side 205 that may be approximately flush with an outer surface 230 of a first hollow cavity sheet mold 213.

The plurality of electronic components may also include a second die 214 coupled with a second side 216 of the package substrate 202 such as by using pillars 218 and 220, for example. Other coupling structures such as spheres or cylinders may be used in various embodiments. A passive component 222 may also be coupled with the second side 216 of the package substrate 202. Additional or fewer passive and/or active components may be coupled with the second side 216 of the package substrate 202 in various embodiments. A second hollow cavity sheet mold 223 may be coupled with the second side 216 of the package substrate 202 and may surround the second die 214 and the passive component 222.

In various embodiments, the dies 204, 214 and/or passive components 212, 222 may be electrically and/or mechanically coupled with the package substrate 202 using one or more solder bonds that are formed using a solderable material. For example, in some embodiments, the passive components 212, 222 may be coupled with the package substrate 202 using solder bonds formed of solder paste. The solder paste may include a mixture of a fluxing agent and a solderable material. The solderable material for the solder bonds may include, for example, tin, silver, gold, copper, lead, antimony, or alloys thereof. The solder bonds may be formed using other solderable materials in some embodiments.

A plurality of through-mold vias such as vias 224, 226, 228 may couple the package substrate 202 with an external surface 230 of the first hollow cavity sheet mold 213. In embodiments, the vias may be created at least in part using a laser ablation technique and a plating process. The vias 224, 226, 228 may be created by placing solder balls or copper blocks as a contact via material on the package substrate 202 (e.g., multilayer laminate), covering the preplaced solder ball or copper block via materials with sheet mold, laser ablating an opening to expose the solder ball or copper block contact points, and plating to create an input/output (IO) connection, in various embodiments. A plurality of contacts such as contacts 232, 234, 236 may be located on the external surface 230 of the first hollow cavity sheet mold 213 and be electrically coupled with the plurality of through-mold vias 224, 226, 228 in various embodiments. The contacts 232, 234, 236 may be LGA pads, for example. The contacts 232, 234, 236 may be plated with a material such as ENEPIG, NiAu, or other solderable surface in various embodiments. A heatsink 231 may be disposed on the outer side 205 of the first die 204 and be formed of the same material as the plurality of contacts 232, 234, 236.

Figure 3:
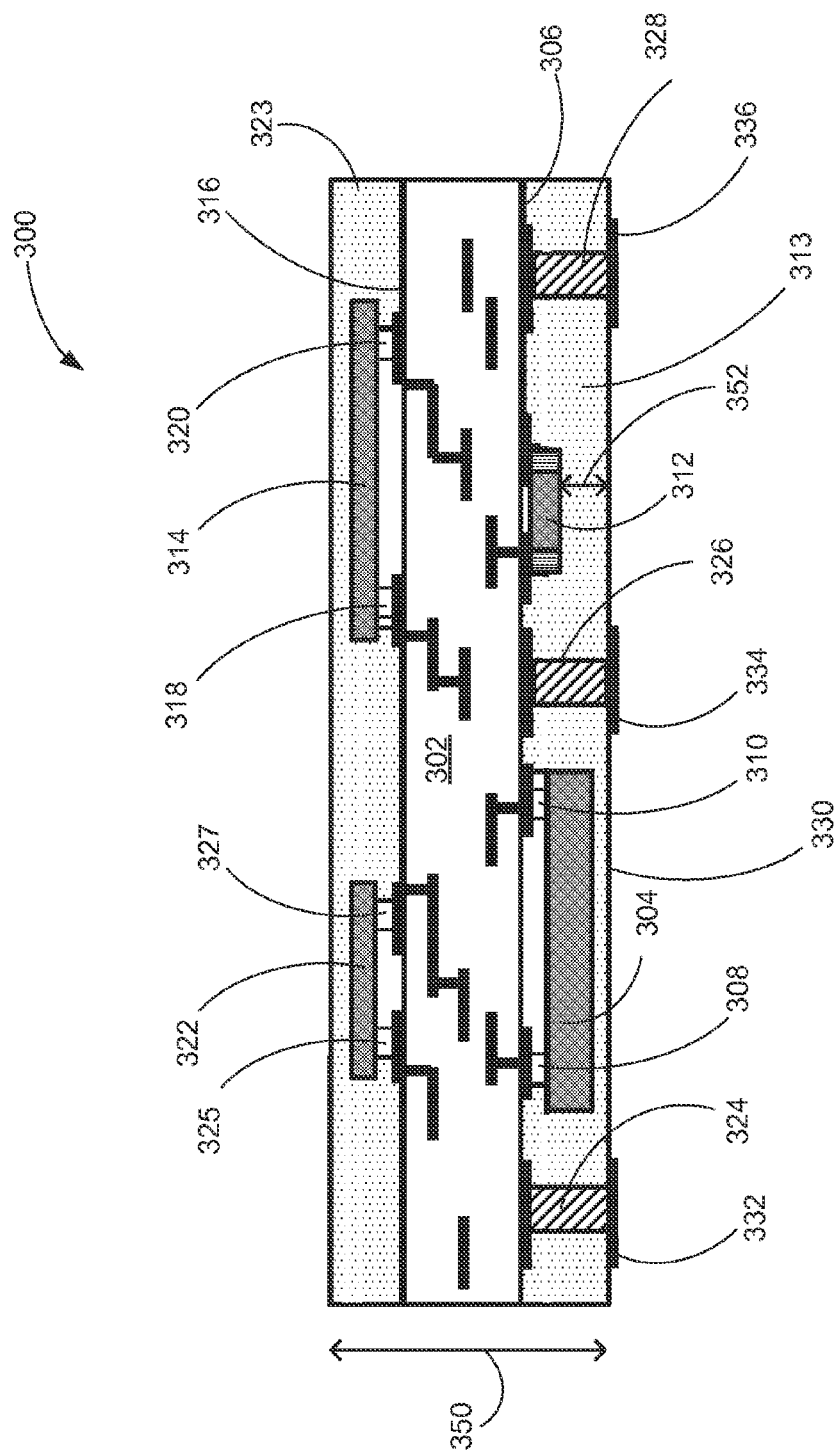
FIG. 3 illustrates a cross-sectional view of a microelectronic device that includes an integrated passive device in accordance with various embodiments.

FIG. 3 illustrates a cross-sectional view of a microelectronic device 300, including an integrated passive device in accordance with various embodiments. The device 300 may include a multilayer laminate package substrate 302 and a plurality of electronic components coupled with the package substrate 302. Aspects of the device 300 may be similar to those of the device 100 or 200 in various embodiments. The device 300 may include a first die 304 coupled with a first side 306 of the package substrate 302 such as by using pillars 308 and 310, for example. Other coupling structures such as spheres or cylinders may be used in various embodiments. A passive component 312 may also be coupled with the first side 306 of the package substrate 302. Additional or fewer passive and/or active components may be coupled with the first side 306 of the package substrate 302 in various embodiments. A first hollow cavity sheet mold 313 may be coupled with the first side 306 of the package substrate 302 and may surround the first die 304 and the passive component 312.

The plurality of electronic components may also include a second die 314 coupled with a second side 316 of the package substrate 302 such as by using pillars 318 and 320, for example. Other coupling structures such as spheres or cylinders may be used in various embodiments. The plurality of electronic components may also include an IPD 322 coupled with the second side 316 of the package substrate 302 such as by using pillars 325 and 327, for example. Other coupling structures such as spheres or cylinders may be used in various embodiments. Additional or fewer passive and/or active components may be coupled with the second side 316 of the package substrate 302 in various embodiments. A second hollow cavity sheet mold 323 may be coupled with the second side 316 of the package substrate 302 and may surround the second die 314 and the passive component 322.

In various embodiments, the dies 304, 314 and/or passive components 312, 322 may be electrically and/or mechanically coupled with the package substrate 302 using one or more solder bonds that are formed using a solderable material. For example, in some embodiments, the passive component 312 may be coupled with the package substrate 302 using solder bonds formed of solder paste. The solder paste may include a mixture of a fluxing agent and a solderable material. The solderable material for the solder bonds may include, for example, tin, silver, gold, copper, lead, antimony, or alloys thereof. The solder bonds may be formed using other solderable materials in some embodiments.

A plurality of through-mold vias such as vias 324, 326, 328 may couple the package substrate 302 with an external surface 330 of the first hollow cavity sheet mold 313. In embodiments, the vias may be created at least in part using a laser ablation technique and a plating process. The vias 324, 326,

328 may be created by placing solder balls or copper blocks as a contact via material on the package substrate 302 (e.g., multilayer laminate), covering the preplaced solder ball or copper block via materials with sheet mold, laser ablating an opening to expose the solder ball or copper block contact points, and plating to create an input/output (IO) connection, in various embodiments. A plurality of contacts such as contacts 332, 334, 336 may be located on the external surface 330 of the first hollow cavity sheet mold 313 and be electrically coupled with the plurality of through-mold vias 324, 326, 328 in various embodiments. The contacts 332, 334, 336 may be land grid array (LGA) pads, for example. The contacts 332, 334, 336 may be plated with a material such as ENEPIG, NiAu, or other solderable surface in various embodiments.

The device 300 may use one or more IPDs in embodiments and have a total thickness 350 of approximately 520 µm to 570 µm including a hollow cavity sheet material thickness of approximately 25 µm to 50 µm covering an IPD on each of the first and second sides of the package substrate 302. In other embodiments, the device 300 may include passive devices using type 01005 packages, with the total thickness 350 being approximately 660 µm to 710 µm including a hollow cavity sheet material thickness of approximately 25 µm to 50 µm covering a passive device on each of the first and second sides of the package substrate 302. A covering thickness 352 over the passive component 312 is shown in FIG. 3. The covering thickness 352 may typically range from approximately 25 µm to 50 µm over a passive device such as the device 312 if it is not an IPD in various embodiments. In embodiments, the covering thickness may not be present over a die or an IPD such that an outer surface of the die or IPD is exposed. In embodiments without hollow cavity sheet material covering the back sides of components coupled with the package substrate, the total thickness may be approximately 460 µm including an approximately 210 µm package substrate thickness, a 100 µm die and/or IPD thickness on each side of the package substrate, and a 30 µm pillar or other connecting structure thickness. The covering thickness may vary in embodiments depending on a variety of factors that may include but are not limited to the type and thickness of hollow sheet mold material applied as well as whether and to what extent a thickness of the hollow sheet mold material is reduced after application, such as by using a post-mold grinding process, for example. The hollow cavity sheet material covering thickness and total thickness may vary in a similar fashion with respect to various embodiments discussed in relation to FIGS. 1, 2, 4, and 5.

Figure 4:
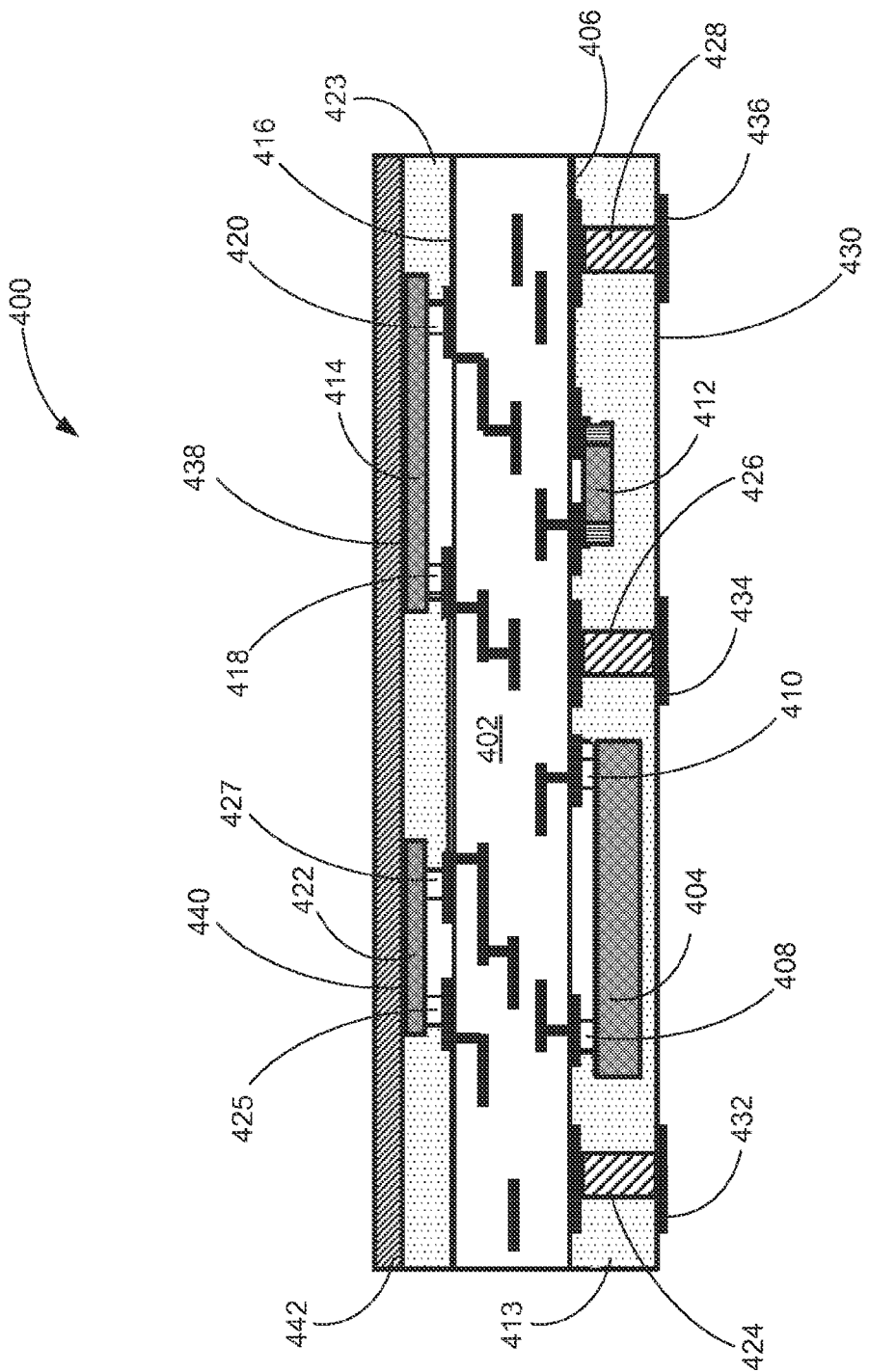
FIG. 4 illustrates a cross-sectional view of a microelectronic device that includes a radio-frequency absorptive layer in accordance with various embodiments.

FIG. 4 illustrates a cross-sectional view of a microelectronic device 400, including a radio-frequency absorptive layer in accordance with various embodiments. The device 400 may include a multilayer laminate package substrate 402 and a plurality of electronic components coupled with the package substrate 402. Aspects of the device 400 may be similar to those of the device 100, 200, or 300 in various embodiments. In similar fashion to that described with respect to device 100, the device 400 may include a first die 404 coupled with a first side 406 of the package substrate 402 such as by using pillars 408 and 410, for example. Other coupling structures such as spheres or cylinders may be used in various embodiments. A passive component 412 may also be coupled with the first side 406 of the package substrate 402. Additional or fewer passive and/or active components may be coupled with the first side 406 of the package substrate 402 in various embodiments. A first hollow cavity sheet mold 413 may be coupled with the first side 406 of the package substrate 402 and may surround the first die 404 and the passive component 412.

The plurality of electronic components may also include a second die 414 coupled with a second side 416 of the package substrate 402 such as by using pillars 418 and 420, for example. Other coupling structures such as spheres or cylinders may be used in various embodiments. The second die 414 may include an active device such as a SAW TX and/or RX device, a BAW TX and/or RX device, or a PA device in various embodiments. The plurality of electronic components may also include a passive component 422 that may be an integrated passive device (IPD) coupled with the second side 416 of the package substrate 402 such as by using pillars 425 and 427, for example. Other coupling structures such as spheres or cylinders may be used in various embodiments. Additional or fewer passive and/or active components may be coupled with the second side 416 of the package substrate 402 in various embodiments. A second hollow cavity sheet mold 423 may be coupled with the second side 416 of the package substrate 402 and may surround the second die 414 and the passive component 422.

In various embodiments, the dies 404, 414 and/or passive components 412, 422 may be electrically and/or mechanically coupled with the package substrate 302 using one or more solder bonds that are formed using a solderable material. For example, in some embodiments, the passive component 412 may be coupled with the package substrate 402 using solder bonds formed of solder paste. The solder paste may include a mixture of a fluxing agent and a solderable material. The solderable material for the solder bonds may include, for example, tin, silver, gold, copper, lead, antimony, or alloys thereof. The solder bonds may be formed using other solderable materials in some embodiments.

A plurality of through-mold vias such as vias 424, 426, 428 may couple the package substrate 402 with an external surface 430 of the first hollow cavity sheet mold 413. In embodiments, the vias may be created at least in part using a laser ablation technique and a plating process. The vias 424, 426, 428 may be created by placing solder balls or copper blocks as a contact via material on the package substrate 402 (e.g., multilayer laminate), covering the preplaced solder ball or copper block via materials with sheet mold, laser ablating an opening to expose the solder ball or copper block contact points, and plating to create an input/output (IO) connection, in various embodiments. A plurality of contacts such as contacts 432, 434, 436 may be located on the external surface 430 of the first hollow cavity sheet mold 413 and be electrically coupled with the plurality of through-mold vias 424, 426, 428 in various embodiments. The contacts 432, 434, 436 may be LGA pads, for example. The contacts 432, 434, 436 may be plated with a material such as ENEPIG, NiAu, or other solderable surface in various embodiments.

A second hollow cavity sheet mold 423 may surround the second die 414 and the passive component 422 in various embodiments. The second die 414 may have an outer surface 438 and the passive component 422 may have an outer surface 440 in various embodiments. A radio-frequency (RF) absorptive layer 442 may cover the outer surface 438 of the second die 414 and the outer surface 440 of the passive component 422 in embodiments. In embodiments, the RF absorptive layer 442 may be an epoxy layer including an iron (Fe) or Fe based component and have some magnetic properties.

Figure 5:
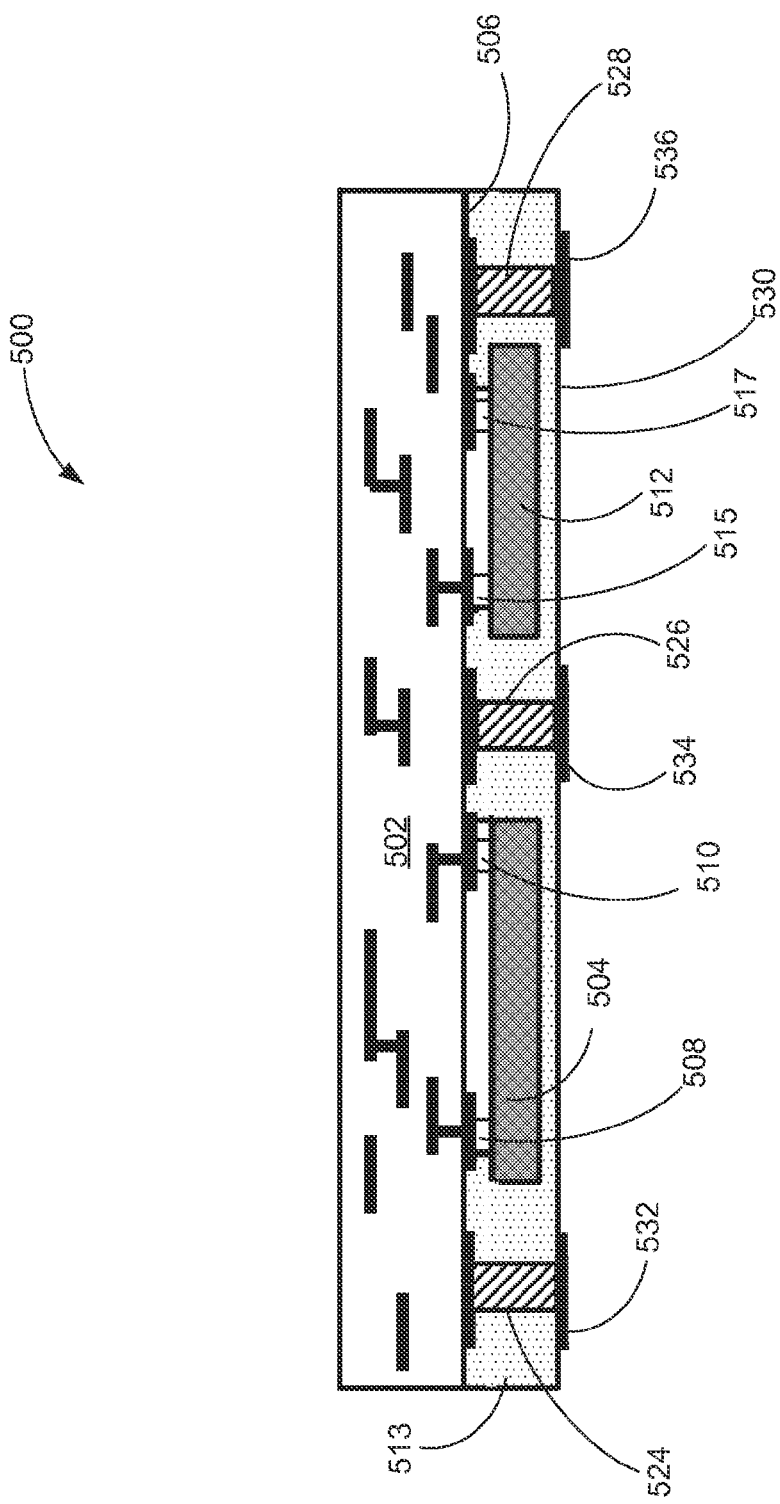
FIG. 5 illustrates a cross-sectional view of a microelectronic device that includes two active devices in a single layer in accordance with various embodiments.

FIG. 5 illustrates a cross-sectional view of a microelectronic device 500, including two active devices in a single layer in accordance with various embodiments. Unlike previous examples, this example only has components on one surface of the substrate. The device 500 may include a multilayer laminate package substrate 502 and a plurality of electronic components coupled with the package substrate 502. Aspects of the device 500 may be similar to those of the device 100, 200, 300, or 400 in various embodiments. In similar fashion to that described with respect to device 100, the device 500 may include a first die 504 coupled with a first side 506 of the package substrate 502 such as by using pillars 508 and 510, for example. Other coupling structures such as spheres or cylinders may be used in various embodiments. The device 500 may also include a second die 512 coupled with the first side 506 of the package substrate 502 such as by using pillars 515 and 517, for example. Other coupling structures such as spheres or cylinders may be used in various embodiments. The device 500 may be used for shielded applications in various embodiments, with the package substrate 502 acting as a shield. The device 500 may be used for package on package (PoP) applications in embodiments.

The first die 504 and the second die 512 may each include an active device such as a SAW TX and/or RX device, a BAW TX and/or RX device, or a PA device in various embodiments. Additional or fewer passive and/or active components may be coupled with the first side 506 of the package substrate 502 in various embodiments. In various embodiments, the dies 504, 512 may be electrically and/or mechanically coupled with the package substrate 302 using one or more solder bonds that are formed using a solderable material. A hollow cavity sheet mold 513 may surround the first die 504 and the second die 512. A second side of the package substrate 502 opposite the first side 506 may remain exposed in various embodiments, or may include a solder resist layer that may be used for marking purposes.

A plurality of through-mold vias such as vias 524, 526, 528 may couple the package substrate 502 with an external surface 530 of the hollow cavity sheet mold 513. In embodiments, the vias may be created at least in part using a laser ablation technique and a plating process. The vias 524, 526, 528 may be created by placing solder balls or copper blocks as a contact via material on the package substrate 502 (e.g., multilayer laminate), covering the preplaced solder ball or copper block via materials with sheet mold, laser ablating an opening to expose the solder ball or copper block contact points, and plating to create an input/output (IO) connection, in various embodiments. A plurality of contacts such as contacts 532, 534, 536 may be located on the external surface 530 of the first hollow cavity sheet mold 513 and be electrically coupled with the plurality of through-mold vias 524, 526, 528 in various embodiments. The contacts 532, 534, 536 may be LGA pads, for example. The contacts 532, 534, 536 may be plated with a material such as ENEPIG, NiAu, or other solderable surface in various embodiments. Although not shown, an outer side of one or more of the dies 504, 512 may be approximately flush with the outer surface 530 of the hollow cavity sheet mold 513. A heatsink may be disposed on one or more of the dies 504, 512 and be formed of the same material as the plurality of contacts 232, 234, 236 in various embodiments in similar fashion as shown and described with respect to FIG. 2.

Figure 6:
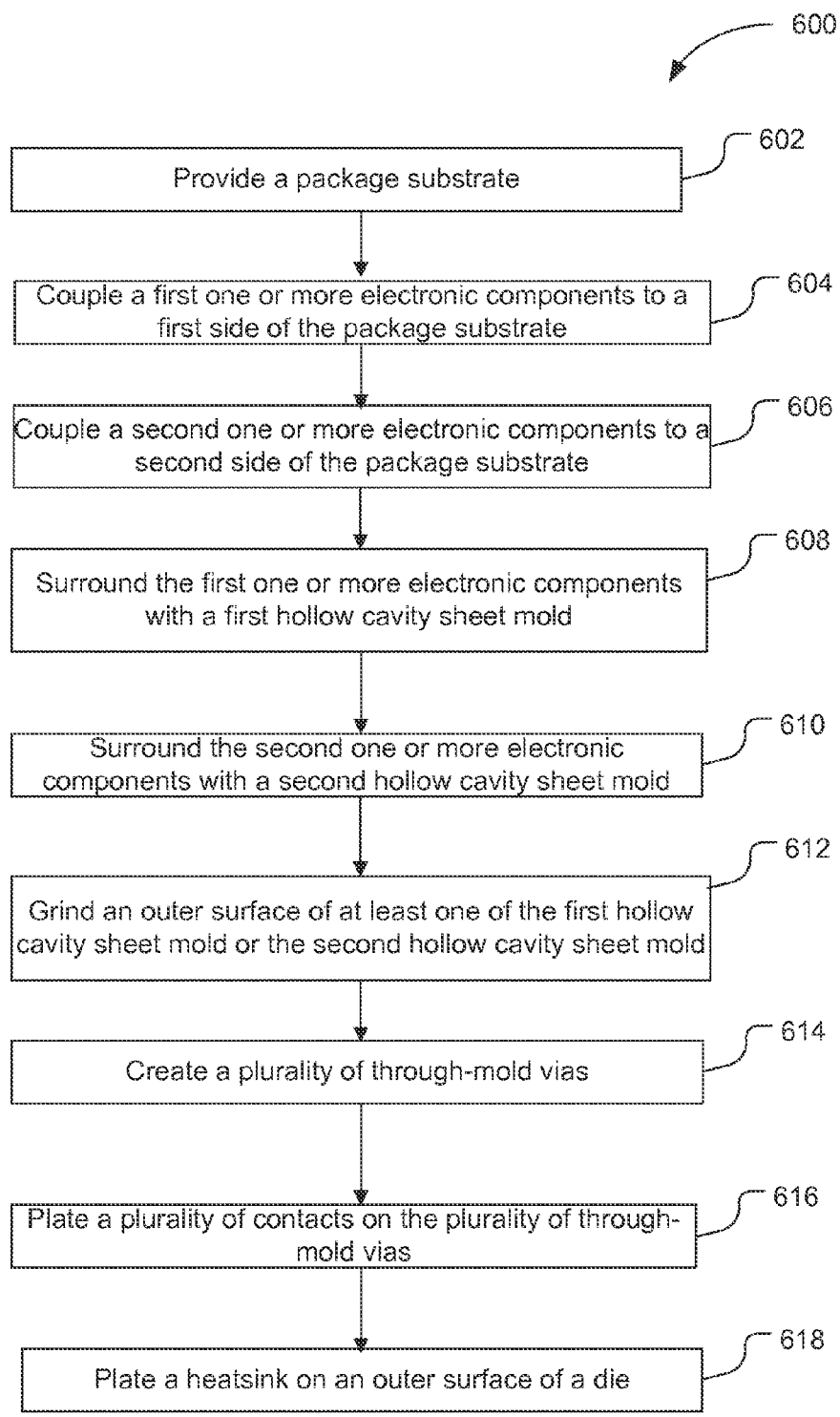
FIG. 6 is a flow diagram of a method for fabricating a microelectronic device in accordance with various embodiments.

FIG. 6 illustrates a flow diagram of a method 600 for fabricating a microelectronic device such as the device 100, 200, 300, 400, or 500 in accordance with various embodiments. At a block 602, a package substrate, such as the package substrate 102 may be provided. In embodiments, the package substrate may include a plurality of pads formed on the substrate. The pads may be configured to receive a corresponding plurality of interconnect structures formed on dies to be coupled with the package substrate.

At operation 604, a first one or more electronic components such as the first die 104 and the passive component 112 may be coupled with a first side of the package substrate. At a block 606, a second one or more electronic components such as the second die 114 and the passive component 122 maybe coupled with a second side of the package substrate. The dies may be coupled with the package substrate in a flip-chip configuration in various embodiments. The dies may have interconnect structures formed thereon. The interconnect structures of the dies may be electrically and/or mechanically coupled with the pads of the package substrate using solder bonds. The pads and the interconnect structures may be composed of an electrically conductive material such as a metal (e.g., copper). In embodiments, the interconnect structures may include pillars that extend to provide a majority of a gap distance between the package substrate and the dies. In various embodiments, the interconnect structures may include pads, bumps, posts, or other structures to facilitate electrical and/or mechanical coupling of the dies to the package substrate. The interconnect structures may extend to provide less than a majority of the gap distance in some embodiments. The solder bonds may include solder bumps in various embodiments. The solder bonds may attach the interconnect structures to the pads on the package substrate facing the dies.

In some embodiments, a fluxing underfill material may be disposed on the package substrate between one or more electronic components such as the dies and the package substrate. The fluxing underfill material may include a fluxing agent and/or an epoxy material. The fluxing agent may facilitate formation of solder bonds by, for example, removing oxidation from solderable surfaces. The fluxing underfill material may include an epoxy material that is configured to harden during a solder reflow process. The fluxing underfill material may include additional and/or other materials in some embodiments.

At a block 608, the first one or more electronic components may be surrounded with a first hollow cavity sheet mold. The hollow cavity sheet mold may be applied using a high viscosity sheet molding material and a low viscosity sheet molding material in various embodiments. In embodiments, the sheet molding material may be a silica filled material held in an amorphous epoxy resin and be applied in two sheets. The first sheet, closest to the package substrate may be a low flow, high viscosity, material and the second sheet may have low viscosity, to enable good planarity in embodiments. At a block 610, the second one or more electronic components may be surrounded with a second hollow cavity sheet mold that may be applied in a similar fashion to the first hollow cavity sheet mold. In embodiments, the first and/or second hollow cavity sheet mold may cover one or more of the electronic components. In various embodiments, a second layer of one or more of the hollow cavity sheet molds may include a radio-frequency absorptive layer.

At operation 612, an outer surface of at least one of the first hollow cavity sheet mold or the second hollow cavity sheet mold may be ground using a post mold package grinding process. This may reduce a height or thickness of the device in various embodiments. In embodiments, the sheet mold may be ground such that an outer surface of a die is approximately flush with an outer surface of the sheet mold, such as is shown in FIG. 2 with respect to the first die 204. In embodiments, a covering layer of approximately 25 µm to 50 µm may be left in place over one or more components such as passive component 112.

At a block 614, a plurality of through-mold vias may be created. In embodiments, a laser ablation process and a plating process may be used to create the vias. The vias may be created by placing solder balls or copper blocks as a contact via material on the package substrate (e.g., multilayer laminate), covering the preplaced solder ball or copper block via materials with sheet mold, laser ablating an opening to expose the solder ball or copper block contact points, and plating to create an input/output (IO) connection, in various embodiments. At a block 616, a plurality of contacts may be plated on the plurality of through-mold vias.

At operation 618, a heatsink, such as the heatsink 231, may be plated on an outer surface of a die such as the first die 204. In various embodiments, the operation performed at the block 616 and the block 618 may be performed at the same time and use the same material for the plurality of contacts and the heatsink. In embodiments, the contacts may be LGA pads. In other embodiments, the process 600 may be performed with more or less modules and/or with some operations in different order. For example, in embodiments, a top of the package laminate substrate may be assembled and sheet molded followed by assembling and sheet molding a bottom of the package laminate substrate such as by assembling a first side at the operation 604 then sheet molding the first side at the block 608 followed by assembling the second side at the block 606 then sheet molding the second side at the block 610.

Figure 7:
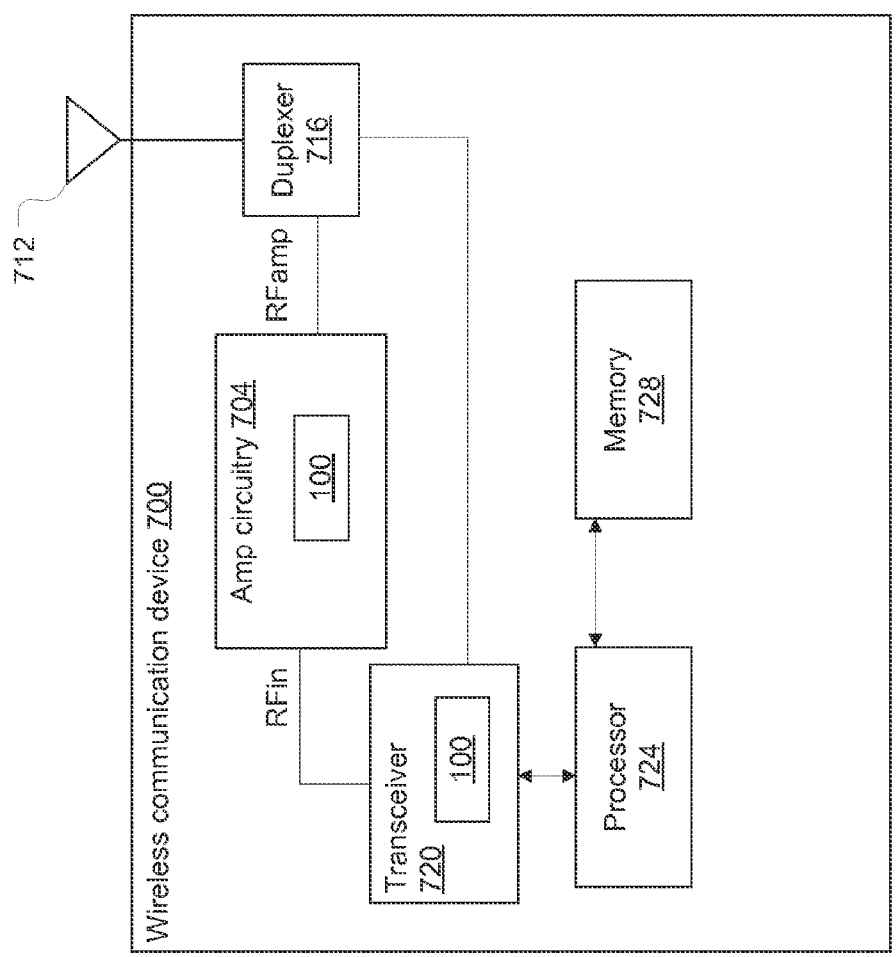
FIG. 7 illustrates a block diagram of a system incorporating a microelectronic device such as, for example, a microelectronic device illustrated in FIG. 1 in accordance with various embodiments.

The device 100, 200, 300, 400, or 500 may be incorporated into any of a variety of apparatuses and systems. A block diagram of an exemplary wireless communication device 700 incorporating device 100 is illustrated in FIG. 7. Although the device is shown as device 100, it should be understood that the device 200, 300, 400, or 500 may also be used. The wireless communication device 700 may include amplification circuitry 704, antenna structure 712, a duplexer 716, a transceiver 720, a processor 724, and a memory 728 coupled with each other at least as shown. The wireless communication device 700 may include the device 100, 200, 300, 400, and/or 500 incorporated into one or more of the components such as, but not limited to, amplification circuitry 704, or transceiver 720. While the wireless communication device 700 is shown with transmitting and receiving capabilities, other embodiments may include wireless communication devices without receiving or transmitting capabilities.

In various embodiments, the wireless communication device 700 may be, but is not limited to, a mobile phone, a paging device, a personal digital assistant, a text-messaging device, a portable computer, a desktop computer, a telecommunications base station, a subscriber station, an access point, a radar, a satellite communication device, or any other device capable of wirelessly transmitting radio-frequency (RF) signals. As the device 100, 200, 300, 400, and/or 500 may have smaller dimensions relative to various related art devices, the system may advantageously be incorporated into portable electronic devices, including mobile phones.

The processor 724 may execute a basic operating system program, stored in the memory 728, in order to control the overall operation of the wireless communication device 700. For example, the processor 724 may control the reception of signals and the transmission of signals by transceiver 720. The processor 724 may be capable of executing other processes and programs resident in the memory 728 and may move data into or out of memory 728, as desired by an executing process.

The transceiver 720 may receive outgoing data (e.g., voice data, web data, e-mail, signaling data, etc.) from the processor 724, may generate an RFin signal to represent the outgoing data, and provide the RFin signal to the amplification circuitry 704.

The amplification circuitry 704 may amplify the RFin signal in accordance with a selected amplification mode. The amplified RFamp signal may be forwarded to the duplexer 716 and then to the antenna structure 712 for an over-the-air (OTA) transmission.

In a similar manner, the transceiver 720 may receive an incoming OTA signal from the antenna structure 712 through the duplexer 716. The transceiver 720 may process and send the incoming signal to the processor 724 for further processing.

In various embodiments, the antenna structure 712 may include one or more directional and/or omnidirectional antennas, including, e.g., a dipole antenna, a monopole antenna, a patch antenna, a loop antenna, a microstrip antenna or any other type of antenna suitable for OTA transmission/reception of RF signals.

Those skilled in the art will recognize that the wireless communication device 700 is given by way of example and that, for simplicity and clarity, only so much of the construction and operation of the wireless communication device 700 as is necessary for an understanding of the embodiments is shown and described. Various embodiments contemplate any suitable component or combination of components performing any suitable tasks in association with wireless communication device 700, according to particular needs. Moreover, it is understood that the wireless communication device 700 should not be construed to limit the types of devices in which embodiments may be implemented.

EXAMPLES

Example 1 may include an apparatus, comprising: a package substrate; a plurality of electronic components disposed on and electrically coupled with the package substrate at one or more sides of the package substrate; one or more hollow cavity sheet molds surrounding the plurality of electronic components and coupled with one or more sides of the package substrate; and a plurality of through-mold vias to couple the package substrate with an external surface of at least one of the hollow cavity sheet molds.

Example 2 may include the subject matter of Example 1, wherein the plurality of electronic components are disposed on a first side of the package substrate, and wherein the plurality of electronic components comprises a first die including a first active component and a second die including a second active component.

Example 3 may include the subject matter of Example 1, wherein the package substrate is a multilayer substrate, the one or more hollow cavity sheet molds comprise a first hollow cavity sheet mold and a second hollow cavity sheet mold, and the plurality of electronic components comprises: a first one or more electronic components disposed on a first side of the package substrate; and a second one or more electronic components disposed on a second side of the package substrate opposite the first side of the package substrate, wherein the first hollow cavity sheet mold surrounds the first one or more electronic components and is coupled with the first side of the package substrate and the second hollow cavity sheet mold surrounds the second one or more electronic components and is coupled with the second side of the package substrate, and wherein the plurality of through-mold vias couple the package substrate with an external surface of the first hollow cavity sheet mold.

Example 4 may include the subject matter of Example 3, further comprising a heat sink disposed on an outer side of a die of the first one or more electronic components.

Example 5 may include the subject matter of Example 4, further comprising a plurality of contacts on an external side of the first hollow cavity sheet mold, wherein the plurality of contacts are electrically coupled with the plurality of through-mold vias, and wherein the heatsink is formed of the same material as the plurality of contacts.

Example 6 may include the subject matter of Example 5, wherein the plurality of contacts are land grid array pads.

Example 7 may include the subject matter of any one of Examples 3-6, further comprising a radio-frequency absorptive layer covering an outer surface of a die of the second one or more electronic components, wherein the die comprises an active component.

Example 8 may include the subject matter of any one of Examples 3-7, wherein the first one or more electronic components comprises a surface acoustic wave device or a bulk acoustic wave device and the second one or more electronic components comprises a surface acoustic wave device, a bulk acoustic wave device, or a power amplifier device.

Example 9 may include the subject matter of any one of Examples 3-8, wherein each of the first and second one or more electronic components includes an active die and a passive component.

Example 10 may include the subject matter of Example 9, wherein a passive component of the second one or more electronic components is an integrated passive device.

Example 11 may include the subject matter of any one of Examples 3-10, wherein a total thickness of the apparatus is no greater than 710 µm.

Example 12 may include the subject matter of any one of Examples 3-10, wherein a total thickness of the apparatus is no greater than 570 µm.

Example 13 may include the subject matter of any one of Examples 9-12, further comprising: a heat sink disposed on an outer side of a die of the first one or more electronic components; and a plurality of contacts on an external side of the first hollow cavity sheet mold, wherein the plurality of contacts are electrically coupled with the plurality of through-mold vias and the heat sink is formed of the same material as the plurality of contacts.

Example 14 may include a portable electronic device comprising the subject matter of any one of Examples 3-13.

Example 15 may include a method comprising: providing a package substrate; coupling a plurality of electronic components to the package substrate in a flip-chip configuration; surrounding the plurality of electronic components with a hollow cavity sheet mold; and creating a plurality of through-mold vias coupling the package substrate to an external surface of the hollow cavity sheet mold.

Example 16 may include the subject matter of Example 15, wherein coupling the plurality of electronic components comprises coupling the plurality of electronic components to one side of the package substrate, and wherein the plurality of components comprises a first die including a first active component and a second die including a second active component.

Example 17 may include the subject matter of Example 15, wherein coupling the plurality of electronic components comprises: coupling a first one or more electronic components to a first side of the package substrate; and coupling a second one or more electronic components to a second side of the package substrate opposite the first side of the package substrate, and wherein surrounding the plurality of electronic components comprises: surrounding the first one or more electronic components with a first hollow cavity sheet mold; and surrounding the second one or more electronic components with a second hollow cavity sheet mold.

Example 18 may include the subject matter of Example 17, wherein creating the plurality of through-mold vias is performed at least in part by laser ablation.

Example 19 may include the subject matter of any one of Examples 17-18, further comprising grinding an outer surface of at least one of the first hollow cavity sheet mold or the second hollow cavity sheet mold.

Example 20 may include the subject matter of Example 19, wherein grinding an outer surface comprises grinding an outer surface of the first hollow cavity sheet mold to expose an outer surface of at least one die of the first one or more electronic components, the method further comprising: plating a plurality of contacts on the plurality of through-mold vias; and plating a heatsink on the outer surface of an exposed die using the same material as that used in plating the plurality of contacts.

Example 21 may include the subject matter of any one of Examples 17-20, further comprising covering an outer surface of a die of the second one or more electronic components with a radio-frequency absorptive layer, wherein the die comprises an active component.

Example 22 may include the subject matter of any one of Examples 17-21, wherein coupling the first one or more electronic components comprises coupling a surface acoustic wave device or a bulk acoustic wave device, and wherein coupling the second one or more electronic components comprises coupling a surface acoustic wave device, a bulk acoustic wave device, or a power amplifier device.

Example 23 may include the subject matter of any one of Examples 17-23, wherein coupling the first one or more electronic components comprises coupling a first passive component and a first die comprising an active component to the first side of the package substrate; and wherein coupling the second one or more electronic components comprises coupling a second passive component and a second die comprising an active component to the second side of the package substrate.

Example 24 may include the subject matter of Example 23, wherein coupling the second passive component comprises coupling an integrated passive device to the second side of the package substrate.

Example 25 may include the subject matter of any one of Examples 23-24, further comprising: grinding an outer surface of the first hollow cavity sheet mold to expose an outer surface of at least one die of the first one or more electronic components; plating a plurality of contacts on the plurality of through-mold vias; and plating a heatsink on the outer surface of an exposed die using the same material as that used in plating the plurality of contacts, wherein plating the plurality of contacts and plating the heatsink are performed at the same time.

Although certain embodiments have been illustrated and described herein for purposes of description of the preferred embodiment, it will be appreciated by those of ordinary skill in the art that a wide variety of alternate and/or equivalent embodiments or implementations calculated to achieve the same purposes may be substituted for the embodiments shown and described without departing from the scope of the present invention. Those with skill in the art will readily appreciate that embodiments in accordance with the present invention may be implemented in a very wide variety of ways. This application is intended to cover any adaptations or variations of the embodiments discussed herein. Therefore, it is manifestly intended that embodiments in accordance with the present invention be limited only by the claims and the equivalents thereof.

What is claimed is:

1. An apparatus comprising:
 a package substrate;
 a plurality of electronic components disposed on and electrically coupled with the package substrate at one or more sides of the package substrate;
 one or more hollow cavity sheet molds surrounding the plurality of electronic components and coupled with one or more sides of the package substrate; and
 a plurality of through-mold vias to couple the package substrate with an external surface of at least one of the one or more hollow cavity sheet molds.

2. The apparatus of claim 1, wherein the plurality of electronic components are disposed on a first side of the package substrate, and wherein the plurality of electronic components comprises a first die including a first active component and a second die including a second active component.

3. The apparatus of claim 1, wherein the package substrate is a multilayer substrate, the one or more hollow cavity sheet molds comprise a first hollow cavity sheet mold and a second hollow cavity sheet mold, and the plurality of electronic components comprises:
 a first one or more electronic components disposed on a first side of the package substrate; and
 a second one or more electronic components disposed on a second side of the package substrate opposite the first side of the package substrate,
wherein the first hollow cavity sheet mold surrounds the first one or more electronic components and is coupled with the first side of the package substrate and the second hollow cavity sheet mold surrounds the second one or more electronic components and is coupled with the second side of the package substrate, and wherein the plurality of through-mold vias couple the package substrate with an external surface of the first hollow cavity sheet mold.

4. The apparatus of claim 3, further comprising a heat sink disposed on an outer side of a die of the first one or more electronic components.

5. The apparatus of claim 4, further comprising a plurality of contacts on an external side of the first hollow cavity sheet mold, wherein the plurality of contacts are electrically coupled with the plurality of through-mold vias, and wherein the heatsink is formed of the same material as the plurality of contacts.

6. The apparatus of claim 5, wherein the plurality of contacts are land grid array pads.

7. The apparatus of claim 3, further comprising a radio-frequency absorptive layer covering an outer surface of a die of the second one or more electronic components, wherein the die comprises an active component.

8. The apparatus of claim 3, wherein the first one or more electronic components comprises a surface acoustic wave device or a bulk acoustic wave device and the second one or more electronic components comprises a surface acoustic wave device, a bulk acoustic wave device, or a power amplifier device.

9. The apparatus of claim 3, wherein each of the first and second one or more electronic components includes an active die and a passive component.

10. The apparatus of claim 9, wherein a passive component of the second one or more electronic components is an integrated passive device.

11. The apparatus of claim 9, wherein a total thickness of the apparatus is no greater than 710 µm.

12. The apparatus of claim 9, wherein a total thickness of the apparatus is no greater than 570 µm.

13. The apparatus of claim 9, further comprising:
 a heat sink disposed on an outer side of a die of the first one or more electronic components; and
 a plurality of contacts on an external side of the first hollow cavity sheet mold, wherein the plurality of contacts are electrically coupled with the plurality of through-mold vias and the heat sink is formed of the same material as the plurality of contacts.

14. A portable electronic device comprising the apparatus of claim 3.

15. A method comprising:
 providing a package substrate;
 coupling a plurality of electronic components to the package substrate in a flip-chip configuration;
 surrounding the plurality of electronic components with a hollow cavity sheet mold; and
 creating a plurality of through-mold vias coupling the package substrate to an external surface of the hollow cavity sheet mold.

16. The method of claim 15, wherein coupling the plurality of electronic components comprises coupling the plurality of electronic components to one side of the package substrate, and wherein the plurality of components comprises a first die including a first active component and a second die including a second active component.

17. The method of claim 15, wherein coupling the plurality of electronic components comprises:
 coupling a first one or more electronic components to a first side of the package substrate; and
 coupling a second one or more electronic components to a second side of the package substrate opposite the first side of the package substrate, and wherein surrounding the plurality of electronic components comprises:
 surrounding the first one or more electronic components with a first hollow cavity sheet mold; and
 surrounding the second one or more electronic components with a second hollow cavity sheet mold.

18. The method of claim 17, wherein creating the plurality of through-mold vias is performed at least in part by laser ablation.

19. The method of claim 17, further comprising grinding an outer surface of at least one of the first hollow cavity sheet mold or the second hollow cavity sheet mold.

20. The method of claim 19, wherein grinding an outer surface comprises grinding an outer surface of the first hollow cavity sheet mold to expose an outer surface of at least one die of the first one or more electronic components, the method further comprising:
 plating a plurality of contacts on the plurality of through-mold vias; and
 plating a heatsink on the outer surface of an exposed die using the same material as that used in plating the plurality of contacts.

21. The method of claim 17, further comprising covering an outer surface of a die of the second one or more electronic components with a radio-frequency absorptive layer, wherein the die comprises an active component.

22. The method of claim 17, wherein coupling the first one or more electronic components comprises coupling a surface acoustic wave device or a bulk acoustic wave device, and wherein coupling the second one or more electronic components comprises coupling a surface acoustic wave device, a bulk acoustic wave device, or a power amplifier device.

23. The method of claim 17, wherein coupling the first one or more electronic components comprises coupling a first passive component and a first die comprising an active component to the first side of the package substrate; and wherein coupling the second one or more electronic components comprises coupling a second passive component and a second die comprising an active component to the second side of the package substrate.

24. The method of claim 23, wherein coupling the second passive component comprises coupling an integrated passive device to the second side of the package substrate.

25. The method of claim 23, further comprising:
grinding an outer surface of the first hollow cavity sheet mold to expose an outer surface of at least one die of the first one or more electronic components;
plating a plurality of contacts on the plurality of through-mold vias; and
plating a heatsink on the outer surface of an exposed die using the same material as that used in plating the plurality of contacts, wherein plating the plurality of contacts and plating the heatsink are performed at the same time.

* * * * *